United States Patent [19]

Einolf, Jr.

[11] 4,137,451
[45] Jan. 30, 1979

[54] DETECTING CIRCUIT FOR A PHOTOCELL PATTERN SENSING ASSEMBLY

[75] Inventor: Charles W. Einolf, Jr., Murrysville Borough, Allegheny County, Pa.

[73] Assignee: Westinghouse Electric Corp., Pittsburgh, Pa.

[21] Appl. No.: 863,192

[22] Filed: Dec. 22, 1977

[51] Int. Cl.² .............................................. G01D 5/34
[52] U.S. Cl. .............................. 250/231 SE; 340/190; 340/347 P
[58] Field of Search ................. 250/231 SE; 340/190, 340/347 P

[56] References Cited

U.S. PATENT DOCUMENTS

| 3,441,923 | 4/1969 | King | 340/190 X |
| 3,846,789 | 11/1974 | Germer et al. | 340/347 P |
| 4,037,219 | 4/1977 | Lewis | 250/231 SE X |

*Primary Examiner*—Lawrence J. Dahl
*Attorney, Agent, or Firm*—R. W. Smith

[57] ABSTRACT

Encoding photocells are positioned in a circuit array for sensing lighted and unlighted variations produced by changes in an optical code pattern. Corresponding signal output changes of the enclosing photocells are detected by being sequentially connected to a sensing network including a reference photocell circuit array. The encoding photocell output changes are sensed at a voltage comparator having inputs connected to the sensing network and a fixed voltage reference to produce a binary signal output. A comparator inhibiting circuit deactivates the comparator in response to a malfunction condition to protect against erroneous operation.

11 Claims, 5 Drawing Figures

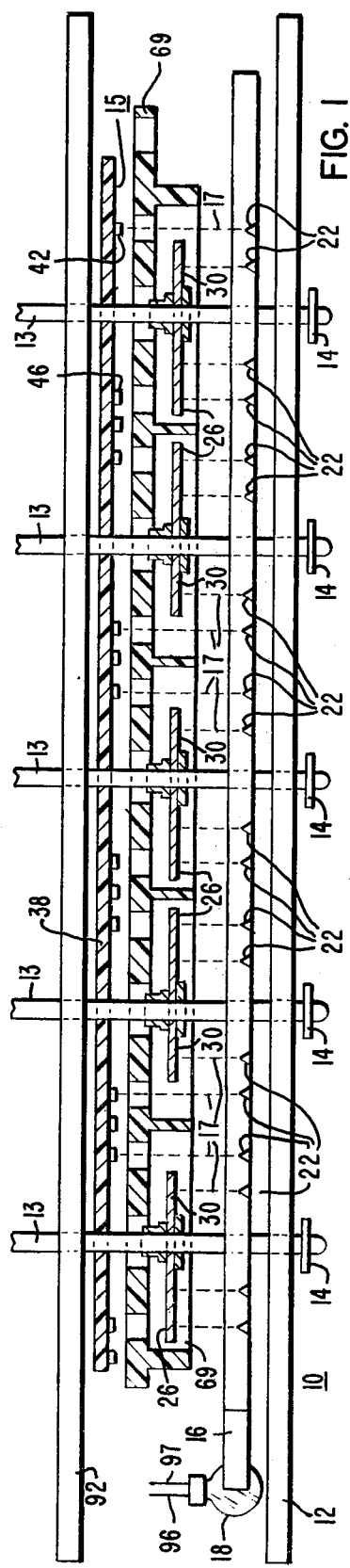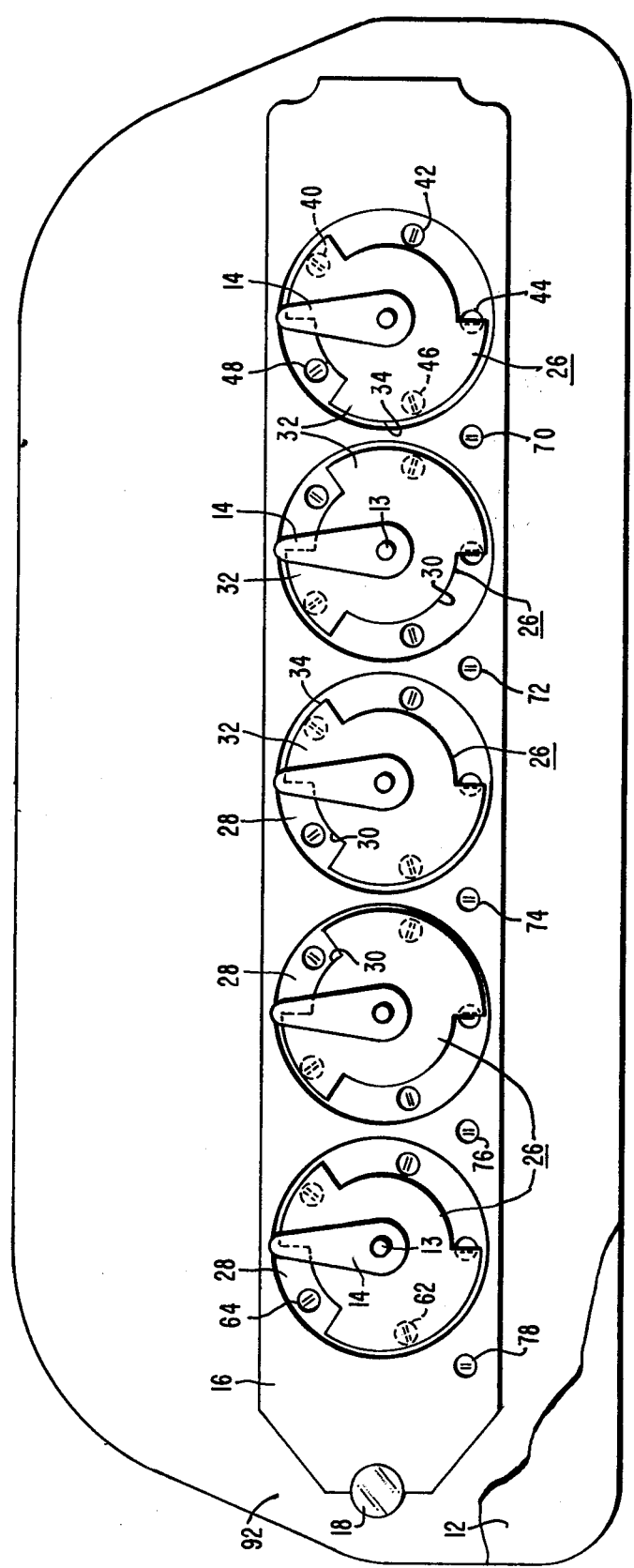

DETECTING CIRCUIT FOR A PHOTOCELL PATTERN SENSING ASSEMBLY

BACKGROUND OF THE INVENTION

This invention relates to a detecting circuit for a photocell pattern sensing assembly and more particularly to such a detecting circuit for sequentially sampling an array of encoding photocells of a common type by sensing the combined output of one of the encoding photocells and the output of a reference circuit including an array of reference photocells of the same common type at a voltage comparator having a precisely controlled analog input signal threshold.

In photocell code pattern sensing assemblies an array of photocell sensors is arranged so as to have sensing positions corresponding to positions of binary coded segments of a code pattern. A specified or varying quantity of information is represented by the light transmitting or blocking states of the code pattern segments. The varying states of the segments are converted to binary coded electrical signals responsive to the outputs of the photocells Photocell signal output values are produced by known photoelectric effects of electron emission, generation of a voltage or by changes in electrical resistance depending upon the type of photocell. Accordingly, increases occur in the photocell current or voltage or decreases occur in the photocell resistance with increases in the light transmitted to the photocell. If light of a given high intensity and light of a substantially lower intensity are represented by two different binary states of the photocell outputs, at least one referenced photocell signal output magnitude must be established and detected as the photocell passes between the lighted and unlighted conditions.

It has been found that photocells of a given specified type may include photoelectric characteristics that vary between photocells of the common type. Accordingly, the photocell output values will vary for a given intensity of light. Also, where large numbers of photocell sensors are used in an array for sensing code pattern segments, there may be differences in the light intensities transmitted to different photocells when the several code pattern segments are in a given light passing or blocking condition. Therefore, another cause of variations in the photocell output values is incident light variations. The above undesired variations are sometimes cumulative and substantially increased when the photocell sensor arrays have large numbers of such photocells compactly mounted in close relationship within a small predetermined space. The small mounting spaces require that the photocell sensors have an extremely small size and close relationships so that there is some difficulty in shielding and isolating light intended to be transmitted to one photocell and blocked from an adjacent photocell by the segments of the code pattern. Also, mass production of photocell arrays by integrated and printed circuit techniques makes close tolerances of the photocell positions and the precise deposition of the photocell composition somewhat difficult. Some of the above-mentioned variable conditions are found in an optoelectronic utility meter register encoder assembly in which the present invention is utilized in one preferred embodiment.

One known technique for detecting a predetermined photocell signal output magnitude includes a Schmitt trigger detector in which the bistable circuit produces a constant amplitude output signal representing one binary state so long as the predetermined photocell output magnitude is exceeded. One such detecting circuit technique is suggested in U.S. Pat. No. 3,484,780 wherein a clipper and amplifier means or Schmitt is described directly connected to cell outputs to produce binary signals. It has been found that when such a bistable circuit is made for very low level signal operation that the bistable threshold level may vary during operation over an undesirable wide range, often as much as thirty to seventy percent. These wide threshold variations make it difficult to accommodate the above-mentioned variations in the photocell characteristics and light intensity variations so as to lead to inaccurate sensing of the code pattern. The inaccuracies further include deviations in the photocell signal output magnitude about the bistable circuit threshold level for a constant light transmitting state of a code segment so that the binary output does not stay stable or at a constant output during a given sampling time for a photocell.

Other detecting circuits for optoelectronic encoders are disclosed in U.S. Pat. Nos. 3,573,773; 3,609,726 and 3,815,126. The aforementioned U.S. Pat. No. 3,609,726 includes the use of photocell sensors in a meter register encoder having photocell outputs which provide signal variations to modulate a variable frequency detector signal and such a detecting technique is not used in the present invention. In U.S. Pat. No. 3,815,126 a meter shaft position encoder includes a photoresistive pattern array connected to a sensing circuit including FET solid state detecting devices. The deteching threshold of these devices is established by the lighted and unlighted resistance values of only the encoding photocell outputs. In U.S. Pat. No. 3,573,773 photocells of an optical pattern sensing array are connected in circuit networks or strings including resistors and diodes. The resistance of the photocells vary between one megohm and ten kilohm when unlighted and lighted, respectively. The outputs from the photocells are applied to an oscillator circuit which has a variable frequency corresponding to the number of lighted photocells.

SUMMARY OF THE INVENTION

In accordance with the present invention a detecting circuit for a photocell pattern sensing assembly includes an array of encoding photocells arranged for sensing opaque and transparent coded segments of a code pattern. An electrical light source provides separate radiations for the photocells. A sequential sampling control circuit connects each of the photocell outputs between a voltage source and a common conductor for sampling the coded values of the photocell outputs. The common photocell output conductor is connected to a reference photocell circuit. The connection of the encoding photocell output to the reference photocell circuit output provides a voltage divider sensing network having the junction of the coding and reference cells providing an output signal to be sensed. The voltage divider sensing network output provides predetermined ratios of an encoding cell output value, in the lighted and unlighted conditions thereof, relative to the lighted reference photocell circuit output value. The signal to be sensed is applied to a first input of an analog voltage comparator. A second input to the comparator includes a fixed voltage reference which establishes a predetermined threshold to switch the comparator output between first and second binary signal levels in response to the magnitude of the signal to be sensed. The present invention further includes an inhibiting circuit producing an enabling signal responsive to the proper energization of the sensing assembly light source which is applied to the voltage comparator. An operating malfunction such as the absence of the light source energization inhibits the comparator operation. The present invention further accommodates a feedback connection between the comparator output and the fixed reference voltage input to provide hysteresis in the turn-on and turn-off thresholds of the cmparator and stabilize the binary signal output when variations occur in the signal to be sensed.

It is a general feature of the present invention to provide a more accurate and stable photocell detecting circuit that is capable of receiving sequentially sampled photocell signal outputs from photocells having varying photoelectric characteristics and being lighted by varying light transmission conditions. A further feature of the present invention is to provide compensation for variations in the resistance characteristics of photoconductive types of encoding photocells by combining each sampled encoding photocell output to a reference photoconductive photocell circuit. The encoding photocell outputs are sensed in a voltage divider sensing network having a predetermined reference voltage produced by reference photocells positioned in an array for detecting light in varying ambient light conditions producing corresponding variations in the encoding photocells. Signals to be sensed are developed in the sensing network at more constant ratios with respect to the reference photocell circuit portion of the network with the signals to be sensed being applied to a precisely controlled analog comparator.

These and other features and advantages of the present invention will become apparent from the detailed description of the drawings which are briefly described hereinafter.

BRIEF DESCRIPTION OF THE DRAWINGS

FIG. 1 is a top diagrammatic view illustrating a forward portion of an electric utility meter register having an optoelectronic encoder including a photocell detecting circuit made in accordance with the present invention;

FIG. 2 is a front diagrammatic view of the encoder parts of the register shown in FIG. 1;

DESCRIPTION OF THE PREFERRED EMBODIMENT

Figure 3:
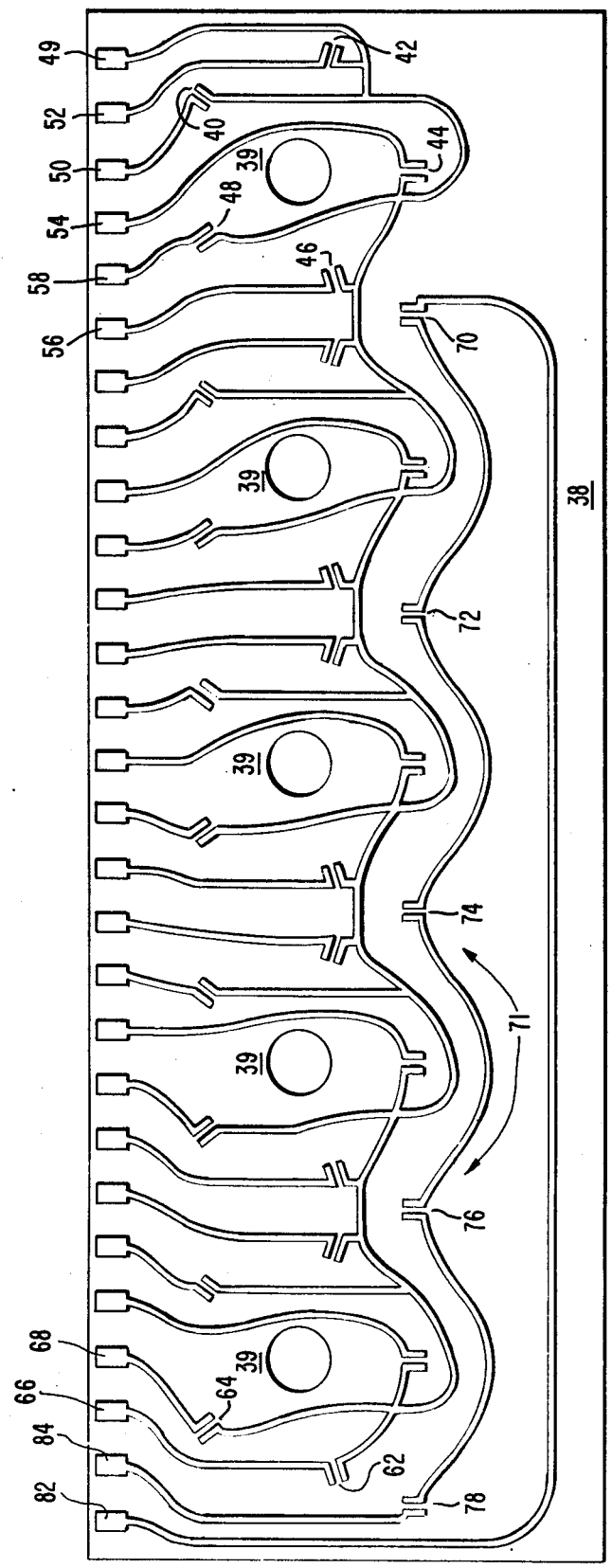
FIG. 3 is a front elevation view of an integrated circuit board included in the register shown in FIG. 1 and illustrating encoding and reference photocell arrays included in the detecting circuit of this invention.

Referring now to the drawings and more particularly to FIG. 1 therein is shown an optoelectronic meter register encoder 10 for encoding dial readings of an electric utility meter as described and claimed in U.S. Pat. No. 4,037,219 issued July 19, 1977, assigned to the assignee of this invention, and incorporated herein by reference.

For purposes of understanding the present invention, the general arrangement of the meter register encoder 10 is briefly described hereinafter with reference to FIGS. 1 and 2. Mounted in front is a register dial plate 12 carrying the forward ends of five pointer shafts 13 each having a pointer indicator 14. A photocell pattern sensing assembly 15 includes a light guide plate 16 and a light source 18 providing plural sources of radiations 17 for the encoder. The assembly 15 further includes an optical code pattern arrangement and photocell sensors described hereinbelow. The light guide plate 16 includes recesses defining point light sources 22 producing the separate radiations 17. It is to be understood that each of the shafts 13 has associated therewith a separate group of five circumferentially spaced point light sources 22 as described in the U.S. Pat. No. 4,037,219.

Five discs 26 are carried separately by each of the pointer shafts 13 and include predetermined shaft angle code patterns formed by opaque and transparent code segments in which transparent segments 28 are formed by shorter radius peripheral disc portions 30 and the opaque code segments 32 of the discs are formed by longer radius peripheral portions 34. The circularly arcuate transparent segments 28 are defined by open spaces between the ends of the arcuate opaque segments 32 of the code pattern discs 26. The code segments 28 and 32 are disposed in a circular orientation for light transmission and blocking alignment with the circular disposed point light sources 22 so as to transmit or block the rearwardly projecting radiations 17 to five pattern sensing positions associated with each shaft as described further in the aforementioned U.S. Pat. No. 4,037,219.

An integrated circuit board 38 carries an encoding photocell array 39 having five groups of five encoding photocells each, shown in FIGS. 2 and 3, with each group aligned with the code pattern of one of the discs 26 and a circular group of five of the point light sources 22. The encoding photocells are each located at the predetermined sensing positions having one of the point light radiations directed thereto. The angular positions of the discs 26 correspond to dial indicating positions of the pointers 14 for corresponding encoding by each group of encoding photocells. The photocell array 39 is provided by integrated circuit photocells on the board 38 that are of a common photoelectric type. In the preferred embodiment disclosed herein, they are a photoconductive type formed by known circuit disposition techniques utilizing photosensitive materials.

A first group of five encoding photocells 40, 42, 44, 46 and 48 is shown in FIGS. 2 and 3 as it is associated with the lowest order and most right-hand one of pointers 14. Printed circuit conductors shown in FIG. 3 connect the encoding photocells 40, 42, 44, 46 and 48 between a common terminal 49 and separate terminals 50, 52, 54, 56 and 58, respectively. Four other identical groups of photocells corresponding to the photocells 40, 42, 44, 46 and 48 are shown in FIGS. 2 and 3 as they are provided for each of the other four pointer shafts which is included in the register encoder 10. The remaining four groups of twenty encoding photocells are similarly connected between the common terminal 49 and separate terminals of the photocell array circuit board 38. Accordingly, the last two encoding photocells 62 and 64 of the most left-hand of the dial pointers 14 are connected between the common terminal 49 and terminals 66 and 68 which are the last two of the twenty-five encoding photocell terminals. The resistance of the photoconductive encoding photocells changes to a lower value when subjected to a change from a darkened condition to an illuminated condition when the transparent segments 28 of the code pattern pass the light radiations 17 from the point light sources 22 to the photocells associated therewith. The resistance of the encoding photocells increases substantially when returned to the unlighted condition by the opaque segments 32, as noted further hereinbelow. A baffle plate 69 aids in isolating the separate radiations 17 between one of the point light sources 22 and an associated encoding cell.

The photocell array circuit board 38 further includes an array 71 of reference photocells 70, 72, 74, 76 and 78 generally equally spaced and distributed across the board 38 adjacent each one of the five groups of encoding photocells. The reference photocells are connected in series between the terminals 82 and 84 of the board 38. The reference photocells are constantly illuminated from four additional and associated point light sources 22, not shown, provided in the light guide plate 16. The reference photocells 70, 72, 74, 76 and 78 are manufactured to have substantially identical characteristics to those of the twenty-five encoding photocells of the board 38 for purposes which will become apparent after the description of FIG. 4 hereinbelow.

Figure 4:
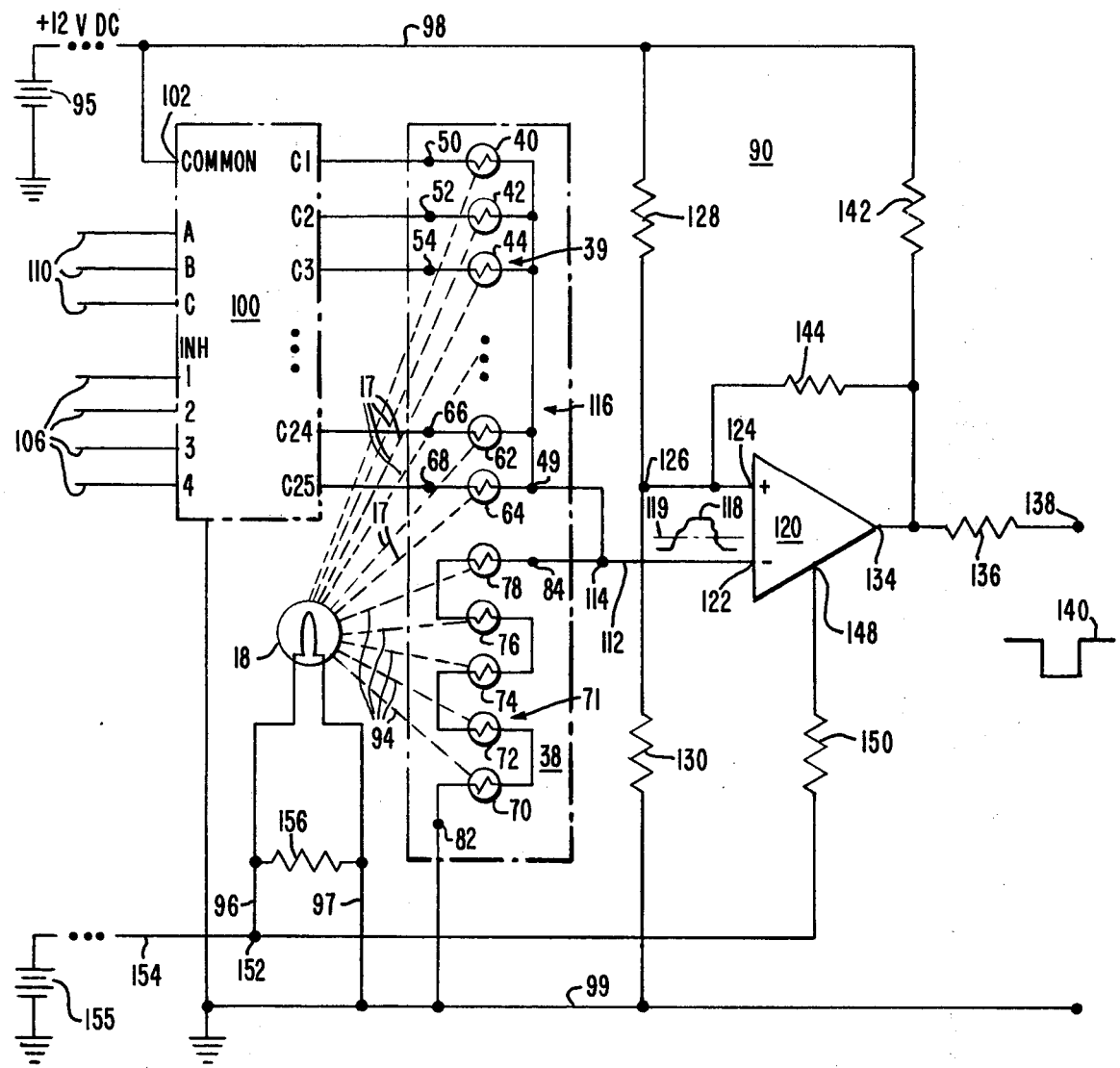
FIG. 4 is an electrical schematic diagram of the photocell detecting circuit of the present invention.

A photocell detecting circuit 90 made in accordance with the present invention is shown in FIG. 4 and is carried on another circuit board 92 shown in FIG. 1. The twenty-five encoding photocells included in the array 39, represented by the photocells 40, 42, 44, 62 and 64, and the reference photocells 70, 72, 74, 76 and 78 of the circuit board 38 and the light source 18 are also illuminated as they are connected to the circuit 90. The encoding photocells 40, 42, 44, 62 and 64 shown in FIG. 4 are representative of the twenty-five encoding photocells which are included in the circuit board 38 shown in FIG. 3 and the remaining encoding photocells are connected between their associated separate terminals and the common terminal 49 in the same manner that the representative photocells are connected as described hereinbelow. The broken lines 17 represent the same radiation paths from the light source 18 and the point light sources 22 shown in FIG. 2. Accordingly, the light transmission paths 17 are alternatively opened or blocked to produce light variations which correspondingly vary the photoelectric resistance characteristics of the encoding photocells of the array 39. The broken lines 94 represent continuous illumination from the light source 18 through the plate 16 and associated point light sources, not shown, to the reference photocells 70, 72, 74, 76 and 78 so long as the light source 18 is energized from conductors 96 and 97 connected to the circuit board 92.

Referring in further detail to the detecting circuit 90 in FIG. 4, an electrical power supply source 95 supplies a nominal plus twelve volts d.c. to a supply conductor 98. The other terminal of the remote supply source is connected in common with the grounded conductor 99. A sequential sampling control circuit 100 can be provided by a multiplexer circuit or, as described in the aforementioned U.S. Pat. No. 4,037,219, by a counter circuit for sequentially switching and sampling each individual encoding photocell of the array circuit board 38. In one preferred embodiment the circuit 100 includes four interconnected type CD4051 COS/MOS analog multiplexers described in the RCA Integrated Circuits Databook published April, 1976 by RCA Solid State, Somerville, N.J. 08876, at pages 540–545. The sequential sampling control circuit 100 includes a common input 102 connected to the supply conductor 98 and twenty-five of the eight channel outputs of the four multiplexers (C1 through C25) are separately connected to the separate encoding photocell terminals of the circuit board 38. All of the channel outputs of the circuit 100 are not shown, it being understood they will be at least the same number of outputs as there are encoding photocells in the array circuit board 38. Accordingly, each of the channel outputs C1, C2, C3, C24 and C25 of the circuit 100 are connected to one terminal, 50, 52, 54, 66 and 68, respectively, of each of the encoding photocells 40, 42, 44, 62 and 64, respectively. Four chip-select conductors 106 are connected to the four inhibit (INH 1-4) inputs of the four multiplexers and three channel-select conductors 110 are connected to the A, B, C inputs of the four multiplexers. Twenty-five different binary logic signals on the conductors 106 and 110 switch the common input 102 to one of the channel outputs C1 through C25. The circuit 100 connects the encoding photocells shown in FIG. 4, and correspondingly all of the encoding photocells of the array 39 one at a time between the voltage source on conductor 98 and the common encoding photocell terminal 49. This produces sequential sampling of the encoding photocells in the detecting circuit 90.

The encoding photocells have the other common terminals thereof each connected through the terminal 49 to a conductor 112 at a junction terminal 114. The array 71 of reference photocells including the series connection of the reference photocells 70, 72, 74, 76 and 78 is connected at terminals 84 and 82 across the junction 114 and the circuit ground conductor 99. The junction 114 provides the output of a voltage divider sensing network 116 formed by the sample switching of one of the encoding photocells to the junction 114 and the reference photocells 70, 72, 74, 76 and 78.

The junction 114 produces a signal to be sensed 118 from the divider sensing network 116. The reference photocell circuit array 71 provides a predetermined reference output at the junction 114 due to a predetermined combined output value of the reference photocells 70, 72, 74 76 and 78 as determined by their photoconductivity when lighted. Although five reference photocells are shown in the circuit array 71, a single or preselected numbers of reference photocells having a predetermined resistance output value can be used so as to produce a predetermined reference signal output at the junction 114 with respect to the output produced across each of the sampled encoding photocells. By way of example and not limitation, one encoding photocell resistance when not illuminated is determined to be greater than approximately five times the resistance of the reference photocell circuit 71 when illuminated. The minimum ratio of the resistance of a non-illuminated photocell to the resistance of an illuminated photocell is selected to be preferably in the order of twenty-five to one. The lighted resistance variations of the encoding photocells, in one working embodiment, averages around 50K to 60K ohms. It has been found that a preferred maximum variation in illuminated resistances between photocells when the encoding photocells are separately illuminated should be at an optimum ratio of maximum to minimum lighted resistance of five to one or slightly less. This ratio is to guarantee that each lighted encoding photocell resistance is always less than the total series resistance of the reference photocells. A smaller than five to one ratio accommodates variations in the circuit operation. The effective operation of the detecting circuit 90 compensates for these resistance variations and other variations in the illuminating conditions on the photocells and variations due to temperature and humidity ambient conditions. The number of reference photocells optimizes the specifications for the array 39 of encoding photocells. For example, if the unlighted to lighted photocell resistance varies in a ratio of sixteen to one, the effective resistance of four reference photocells is used and a required optimum ratio of lighted photocell resistance is four to one or slightly less so that the resistance of the lighted reference photocell circuit array is always more than the resistance of a lighted encoding cell.

Having described the circuit connection for sampling and sensing encoding photocell outputs, an analog voltage comparator 120 and the associated circuitry is now described for detecting the signal to be sensed 118. The comparator 120 in one preferred embodiment is a voltage comparator type LM211 available from the National Semiconductor Corp., Santa Clara, Calif. 95051, and described in the National Linear Data Book dated June 1976. The analog comparator 120 is connected at a first input 122 to the voltage divider sensing network 116 at junction 114 for receiving the signal to be sensed 118. A second comparator input 124 is connected to the junction 126 of two voltage reference resistors 128 and 130 connected across the supply conductor 98 and grounded conductor 99. The resistors 128 and 130 provide a fixed reference voltage to precisely control the analog signal threshold value of the analog comparator 120. The values of resistors 128 and 130 are established with respect to the changes in magnitude of the signal to be sensed 118 which, as described hereinabove, is established with respect to the voltage divider sensing network 116.

The output 134 of the comparator 120 is connected through a resistor 136, being a current limiting and protecting resistor, to the detecting circut output terminal 138. A detecting circuit binary output signal 140 is produced between the output terminal 138 and ground, provided by the conductor 99. A pull-up resistance 142 is connected between the supply conductor 98 and the comparator output 134. The voltage supply inputs to the comparator 120, not shown, are connected in a known manner between the supply conductor 98 and ground conductor 99.

A feedback resistor 144 is connected between the output 134 of the comparator 120 and the second input 124 which is also connected to the junction 126. Hysteresis is provided by the feedback resistor 144 so that the transfer function characteristic of the comparator 120 prevents oscillations in the output signal 140 from occurring during variations in the signal to be sensed 118 when a sampled encoding cell is in a given lighted or unlighted coding condition. Such output signal variations can be produced by variations in the ambient light intensity or point light source transmission impinging on an encoding photocell being sampled. The hysteresis characteristic is discussed further hereinbelow in connection with the description of the graph shown in FIG. 5.

A further important feature of the detecting circuit 90 is a malfunction inhibiting circuit connected to the balance/strobe input 148 of the comparator 120. A resistor 150 is connected between the input 148 and a junction 152 connected between the light source conductor 96 and a light energizing supply conductor 154. When a remote energizing voltage source 155 is being applied from the conductor 154 to the light source 18, the strobe input is enabled through the resistor 150 so that the analog comparator 120 is active to output normally. If the energizing voltage 155 is improperly omitted and not being applied to the light source 18, the low resistance of the lamp 18 effectively pulls the strobe input 148 to ground and inhibits operation of the comparator 120 so it is inactive. A resistor 156 can be connected in parallel with the light source 18 to protect the strobe input in case the light burns out or is defective. It is contemplated that other malfunction conditions may be selected to inhibit the comparator 120.

The nominal analog signal threshold 119 of the analog comparator 120 is initially selected to be approximately six volts or about one-half of the circuit supply voltage on conductor 98 as established by the reference voltage resistors 128 and 130. With the general relative photocell photoelectric resistance parameters noted hereinabove, the signal to be sensed 118 provides an analog input to the comparator input 122 that is very low approaching the ground potential when the encoding photocell being sampled is not lighted and the reference photocells are lighted in the circuit array 71. The resistance ratio of the unlighted encoding photocell to the lighted reference photocell circuit resistance is such that there is a substantially higher voltage drop across the sampled unlighted encoding photocell, connected by circuit 100 between the conductor 98 and junction 114, than there is across the lighted reference photocell circuit array 71. When the encoder photocell being sampled is illuminated the voltage of the signal to be sensed 118 goes substantially higher and approaches the voltage of the conductor 98 since the ratio of the lighted encoding photocell resistance to the combined resistances of the lighted reference photocell circuit is low. Since the photocell resistances vary between photocells, it is seen that if the lighted photocell resistance variations within the prescribed limits of the maximum not being more than approximately slightly less than five times the minimum lighted resistance, the variable ratios relative to the reference photocell resistance is such that the threshold of the comparator 120 is still exceeded by the signal to be sensed 118.

Figure 5:
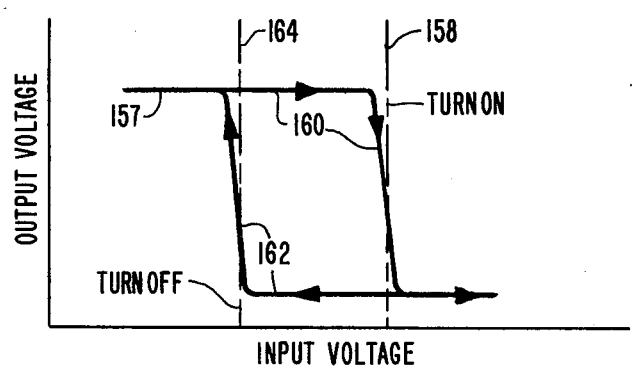
FIG. 5 is a graph of a transfer function characteristic of an analog voltage comparator included in the circuit shown in FIG. 4.

The input-output transfer characteristic of the analog comparator 120 is shown by curve 157 in FIG. 5 and the turn-on input threshold value 158 is reached by the right-hand extending and decreasing portion 160 of the curve at which point the signal to be sensed 118 triggers a high-to-low change in the comparator output signal 140 and remains at a low binary level close to ground voltage. The hysteresis provided by the resistor 144 maintains the low binary output voltage level as the comparator input signal 118 decreases as indicated by the left-hand extending and increasing portion 162 of the curve 157. The spaced turn-off threshold 164 provides approximately one volt variation between the comparator turn-on and turn-off threshold voltage values 158 and 164 and in embodiment they are 6.6 and 5.4 volts, respectively. Accordingly, when there are slight variations occurring signal to be sensed 118 during a sampling period in which one of the encoding photocells is being detected, the input variations decreasing below the turn-on threshold will not produce a change in the detecting circuit output signal 140. Accordingly, when the photocell is not lighted due to an opaque segment of the code pattern, the output signal 140 has a high binary level state approaching the level of the circuit supply conductor 98. When a transparent coded segment of the code pattern passes light transmissions to the encoding photocell, the turn-on threshold of the analog voltage comparator 120 is exceeded and the output signal 140 drops to approach the ground voltage of the conductor 99 and change from the high to the low binary state. The high binary state has a signal level of 9.6 volts at the output 138 in one embodiment.

The strobe input 148 of the comparator 120 is enabled by the energization of the lamp 18 so that an improper or omitted circuit connection of the lamp 18 inhibits operation of the comparator 120 and no output will be produced until the malfunction condition is corrected. An outage because of a defective lamp is readily detectable by the output signal 140 not changing state with operation of the register and rotation of the code patterns.

While the description of the present invention has been made with reference to a specific embodiment it is apparent to those skilled in the art that other modifications and alterations may be made without departing from the spirit and scope of this invention.

What I claim is:

1. A photocell detecting circuit for sensing a coded pattern of light radiations produced by an optically coded pattern having opaque and transparent code segments which correspondingly transmit and block the light radiations at a plurality of sensing positions, said photocell detecting circuit comprising:

an array of encoding photocells having a separate one of said encoding photocells located at each of said sensing positions for response to the transmitted and blocked coded light radiations;

a reference photocell circuit including at least one reference photocell located for receiving light radiations independent of said coded light radiations;

means including a sequential sampling control circuit for combining lighted and unlighted output values of each encoding photocell with a lighted output value of said reference photocell circuit so as to produce a signal to be sensed having variable magnitudes responsive to the combined output values of separate ones of said encoding photocells and of said reference photocell circuit;

analog voltage comparator means having first and second inputs and an output, said first input receiving said signal to be sensed, said second input having a predetermined reference voltage connected thereto to establish a predetermined threshold value in said comparator means, and said output of said comparator means producing an output binary signal having first and second signal values responsive to the signal to be sensed increasing and decreasing above and below said threshold value; and inhibiting circuit means connected to said comparator means so as to render the comparator output active and inactive in response to the presence or absence, respectively, of a predetermined malfunction condition in said photocell detecting circuit.

2. A photocell detecting circuit as claimed in claim 1 wherein said reference photocell circuit includes plural reference photocells each of a type substantially identical to said encoding photocells, and further wherein the ratio of the unlighted and lighted output values of said encoding photocells are greater than a first predetermined ratio value and the ratio of the unlighted encoding photocell and lighted reference photocell circuit output values are not less than a second predetermined ratio value.

3. A photocell detecting circuit as claimed in claim 2 including feedback circuit means connected between said output and said second input of said comparator means so as to establish a predetermined hysteresis whereby the turn-on threshold for changing the output binary signal to the first value is different than a turn-off threshold for changing the output binary signal to the second value.

4. A photocell detecting circuit as claimed in claim 2 wherein said encoding and reference photocells are of a photoconductive type having variations in photoelectric output resistance values.

5. A photocell detecting circuit as claimed in claim 4 including a circuit board having said arrays of encoding and reference photocells formed thereon by integrated circuit dispositions thereon.

6. A photocell detecting circuit as claimed in claim 5 wherein said encoding photocells are arranged in a plurality of groups of encoding photocells distributed between the ends of said circuit board and said array of reference photocells has separate ones of the reference photocells generally equally distributed between the ends of the circuit board and adjacent the groups of encoding photocells.

7. A photocell detecting circuit as claimed in claim 5 wherein said circuit board includes a common printed circuit terminal connected to one electrode of each of the encoding photocells and separate printed circuit terminals connected to each of the other electrodes of the encoding photocells, and further wherein the electrodes of said reference photocells are connected in series with two further printed circuit terminals of said circuit board, and said detecting circuit further including circuit means connecting said common terminal of said encoding photocells in series with one of said two further terminals of the series-connected reference photocells so as to form a voltage divider sensing network producing said signal to be sensed at the junction of said encoding and reference photocells.

8. A photocell detecting circuit for an optoelectronic meter register encoder including a coded pattern means associated with each pointer shaft of a meter register dial for transmitting and blocking light radiations at each of plural groups of sensing positions associated with each of said pointer shafts, said photocell detecting circuit comprising:

an array of encoding photocells formed into plural groups of encoding photocells circumferentially disposed about each of said pointer shafts and at said sensing positions associated therewith for receiving the coded blocked and transmitted light radiations;

an array of reference photocells positioned adjacent to said plural groups of said encoding photocells and receiving continuous light radiations;

means connecting said reference photocells in series and to one electrode of each said encoding photocells to form a voltage dividing sensing network having an output at the junction of said encoding photocells and said reference photocells;

a voltage source;

sequential sampling control means having a common input connected to said voltage source and a plurality of outputs connected to the other electrodes of said encoding photocells for sequentially energizing a separate one of said encoding photocells and said series-connected reference photocells so as to develop a signal to be sensed at said output of said sensing network;

voltage comparator means having a first input receiving said signal to be sensed, a second input receiving a reference voltage establishing a predetermined turn-on threshold value, an output, and a feedback resistance connected between said output and said second input for establishing a predetermined turn-off threshold value so that said output produces a binary signal in response to said signal to be sensed exceeding said turn-on and turn-off threshold values; and inhibiting circuit means connected to said comparator means to render said comparator active and inactive in response to a malfunction condition in said detecting circuit.

9. A photocell detecting circuit as claimed in claim 8 including a source of illumination for producing the coded light radiations and a second voltage source for energizing said source of illumination, and further including means for connecting said second voltage source to said inhibiting circuit means so as to render said comparator means inactive when said source of illumination is not energized.

10. The photocell detecting the circuit as claimed in claim 9 wherein said sequential sampling control means includes a multiplex circuit including inputs receiving coded signals controlling the sequential energization of said encoding photocells.

11. The photocell detecting circuit as claimed in claim 10 wherein said encoding and reference photocells are a common photoconductive type formed on a common circuit board.

* * * * *